(12) United States Patent
Motoda

(10) Patent No.: US 8,659,194 B2
(45) Date of Patent: Feb. 25, 2014

(54) MOTOR DRIVE APPARATUS

(75) Inventor: Haruaki Motoda, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 124 days.

(21) Appl. No.: 13/441,984

(22) Filed: Apr. 9, 2012

(65) Prior Publication Data

US 2013/0069454 A1 Mar. 21, 2013

(30) Foreign Application Priority Data

Sep. 15, 2011 (JP) ................................. 2011-201407

(51) Int. Cl.
*H02K 1/32* (2006.01)

(52) U.S. Cl.
USPC ............................. 310/64; 310/71; 310/68 R

(58) Field of Classification Search
USPC .................................. 310/64, 71, 68 R, 68 D
See application file for complete search history.

(56) References Cited

U.S. PATENT DOCUMENTS

| 6,720,689 | B2 | 4/2004 | Agnes et al. | |
|---|---|---|---|---|
| 7,075,201 | B2 * | 7/2006 | Takahashi et al. | 310/68 D |
| 7,207,187 | B2 * | 4/2007 | Funahashi et al. | 62/228.4 |
| 7,541,703 | B2 * | 6/2009 | Uehara et al. | 310/68 D |
| 7,679,915 | B2 * | 3/2010 | Isomoto et al. | 361/715 |
| 7,999,425 | B2 * | 8/2011 | Utsumi et al. | 310/68 D |
| 8,299,644 | B2 | 10/2012 | Iwai et al. | |
| 2005/0167183 | A1 * | 8/2005 | Tominaga et al. | 180/444 |
| 2010/0117466 | A1 * | 5/2010 | Gas et al. | 310/62 |
| 2011/0254388 | A1 * | 10/2011 | Yamasaki | 310/43 |
| 2011/0285223 | A1 * | 11/2011 | Miyachi et al. | 310/64 |
| 2011/0285226 | A1 * | 11/2011 | Fujita et al. | 310/71 |

FOREIGN PATENT DOCUMENTS

| JP | 2005-536970 A | 12/2005 |
|---|---|---|
| JP | 2010-269693 A | 12/2010 |
| JP | 2011-10410 A | 1/2011 |
| JP | 2011-125212 A | 6/2011 |

OTHER PUBLICATIONS

Japanese Office Action Dated Jul. 23, 2013 {Two (2) Pages}.

* cited by examiner

*Primary Examiner* — Thanh Lam
(74) *Attorney, Agent, or Firm* — Crowell & Moring LLP

(57) ABSTRACT

A motor drive apparatus includes a motor; and an ECU. The ECU includes an ECU housing. The ECU housing includes a heat sink having a module receiving portion. The module receiving portion includes a heat-receiving surface and an opening portion open to one-end side of the ECU housing. The ECU further includes a control substrate received by the ECU housing to be perpendicular to the heat-receiving surface and to face the motor; a plurality of semiconductor modules each received in the module receiving portion and connected electrically with the control substrate to control a power supply of the motor. Each of the plurality of semiconductor modules includes a heat-radiating surface at an outer portion thereof. The ECU further includes a module retaining section pressing the heat-radiating surface to the heat-receiving surface to retain each of the plurality of semiconductor modules in the module receiving portion.

6 Claims, 10 Drawing Sheets

MOTOR DRIVE APPARATUS

BACKGROUND OF THE INVENTION

The present invention relates to a motor drive apparatus that is applied to, for example, a power steering apparatus of a vehicle and that is adapted to produce a steering assist torque through a speed reducer, a pump or the like connected to the motor.

Japanese Patent Application. Publication No. 2010-269693 discloses a previously-proposed motor drive apparatus which is applied to a power steering apparatus of a vehicle.

In this technique, an ECU is disposed at a tip side of motor coaxially thereto and in series with the motor, in order to downsize the motor drive apparatus.

SUMMARY OF THE INVENTION

However, in the above previously-proposed motor drive apparatus, a heat-radiating surface of a semiconductor switching element which has a largest surface area of the semiconductor switching element is in contact with a heat spreader abutting on a surface of a cover member which faces a control substrate. That is, the heat spreader is interposed between the heat-radiating surface of the semiconductor switching element and the cover member to radiate heat of the semiconductor switching element.

Because a plurality of semiconductor switching elements are necessary for the motor drive apparatus, especially, a large range of the cover member is used for cooling the respective semiconductor switching elements (i.e., an outer diameter of the cover member is enlarged). Hence, there is a problem that the motor drive apparatus cannot be sufficiently downsized.

It is therefore an object of the present invention to provide a motor drive apparatus devised to sufficiently downsize the apparatus.

According to one aspect of the present invention, there is provided a motor drive apparatus comprising: a motor; and an ECU provided on an axially one-end side of the motor and configured to perform a drive control of the motor, the ECU including: an ECU housing whose one-end side is open, the ECU housing including a heat sink located at an inner portion of the ECU housing, the heat sink including a module receiving portion, the module receiving portion including a heat-receiving surface and an opening portion open to the one-end side of the ECU housing; a control substrate received by the ECU housing to be substantially perpendicular to the heat-receiving surface and to face the motor; a plurality of semiconductor modules each inserted through the opening portion and received in the module receiving portion, wherein each of the plurality of semiconductor modules is connected electrically with the control substrate to control a power supply of the motor, wherein each of the plurality of semiconductor modules includes a heat-radiating surface at an outer portion thereof; and a module retaining section pressing the heat-radiating surface to the heat-receiving surface to retain each of the plurality of semiconductor modules in the module receiving portion.

According to another aspect of the present invention, there is provided a motor drive apparatus comprising: a motor; and an ECU provided on an axially one side of the motor and configured to perform a drive control of the motor, the ECU including: an ECU housing whose one-end side is open, the ECU housing including a heat sink located at an inner portion of the ECU housing, the heat sink including a module receiving portion, the module receiving portion including a heat-receiving surface and an opening portion open to the one-end side of the ECU housing; a control substrate received by the ECU housing to be substantially perpendicular to the heat-receiving surface and to face the motor; a plurality of semiconductor modules each inserted through the opening portion and received in the module receiving portion, wherein each of the plurality of semiconductor modules is connected electrically with the control substrate to control a power supply of the motor, wherein each of the plurality of semiconductor modules includes a heat-radiating surface at an outer portion thereof; and a module retaining section interposed between the module receiving portion and each of the plurality of semiconductor modules through the opening portion such that a heat generated in each of the plurality of semiconductor modules is transmitted from the heat-radiating surface directly to the heat-receiving surface or indirectly through the module retaining section to the heat sink, wherein the module retaining section retains and fastens each of the plurality of semiconductor modules in the module receiving portion.

According to still another aspect of the present invention, there is provided a motor drive apparatus comprising: a motor; and an ECU provided on an axially one side of the motor and configured to perform a drive control of the motor, the ECU including: an ECU housing whose one-end side is open, the ECU housing including a heat sink located at an inner portion of the ECU housing, the heat sink including a module receiving portion, the module receiving portion including a heat-receiving surface and an opening portion open to the one-end side of the ECU housing; a control substrate received by the ECU housing to be substantially perpendicular to the heat-receiving surface and to face the motor; and a plurality of semiconductor modules each received and retained inside the module receiving portion through the opening portion in a pressed state, wherein each of the plurality of semiconductor modules is connected electrically with the control substrate to control a power supply of the motor, wherein each of the plurality of semiconductor modules includes a heat-radiating surface at an outer portion thereof such that a heat generated in the each of the plurality of semiconductor modules is transmitted from the heat-radiating surface through the heat-receiving surface to the heat sink.

The other objects and features of this invention will become understood from the following description with reference to the accompanying drawings.

BRIEF DESCRIPTION OF THE DRAWINGS

FIG. 7(a) is a view showing a state where the power substrate has been attached in a substrate receiving portion of an ECU housing.

FIG. 7(b) is a view showing a state where a connector has been attached to the state of FIG. 7(a). FIG. 7(c) is a view showing a state where module retaining members have been inserted into the state of FIG. 7(b) so that power modules are fixed. FIG. 7(d) is a view showing a state where a control substrate has been attached to the state of FIG. 7(c).

DETAILED DESCRIPTION OF THE INVENTION

Figure 1:
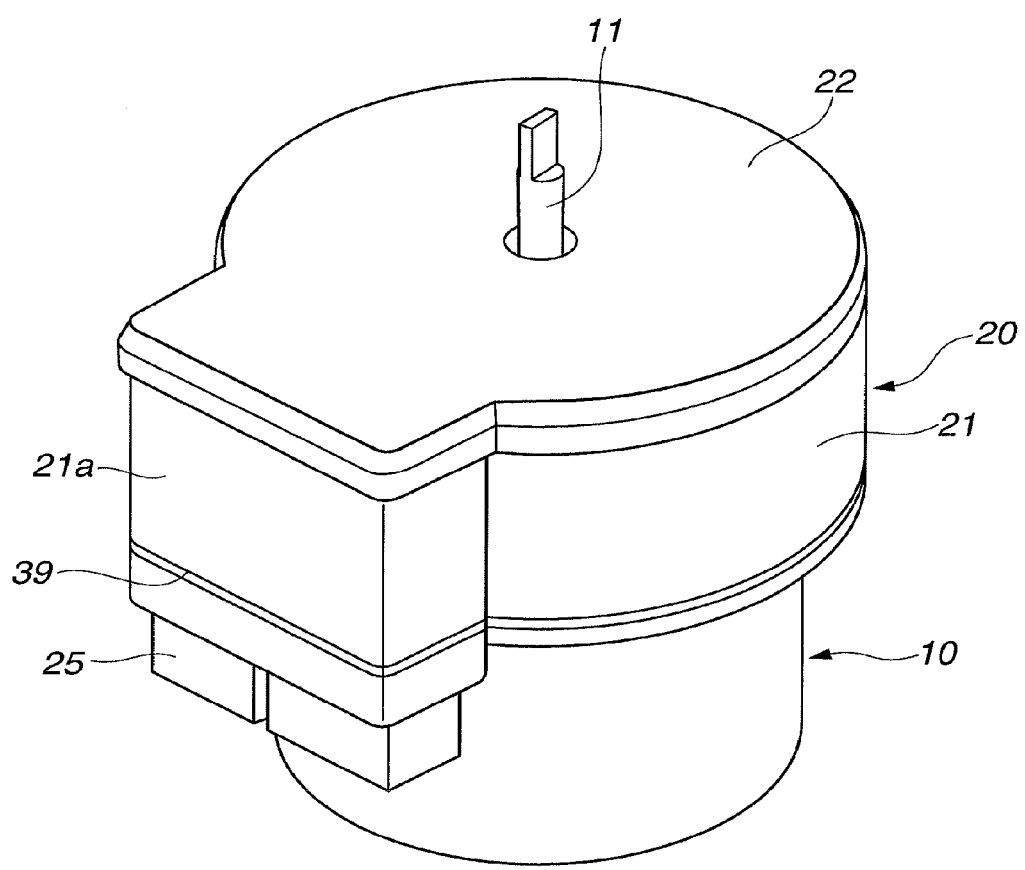
FIG. 1 is an oblique perspective view of external appearance of a motor drive apparatus according to the present invention.

Reference will hereinafter be made to the drawings in order to facilitate a better understanding of the present invention. Respective embodiments of motor drive apparatus according to the present invention will be explained below in detail, referring to the drawings.

Figure 2:
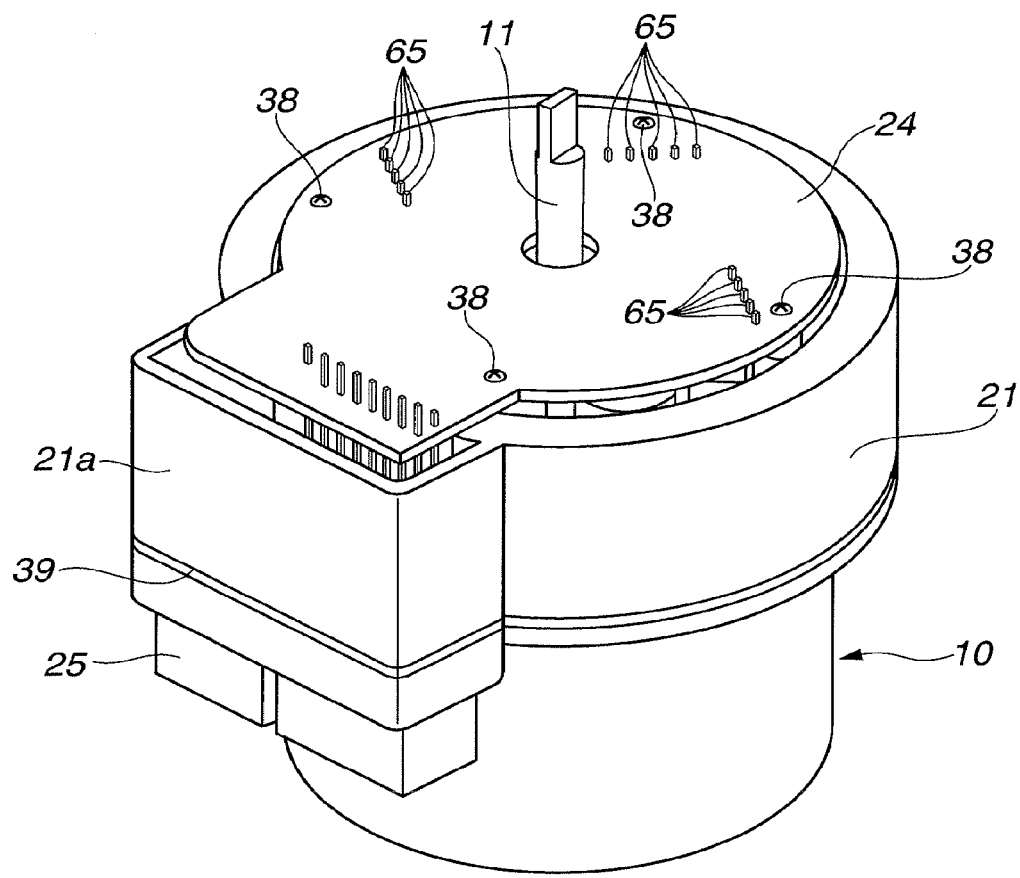
FIG. 2 is a view showing a state where an ECU cover has been detached from the motor drive apparatus of FIG. 1.
Figure 3:
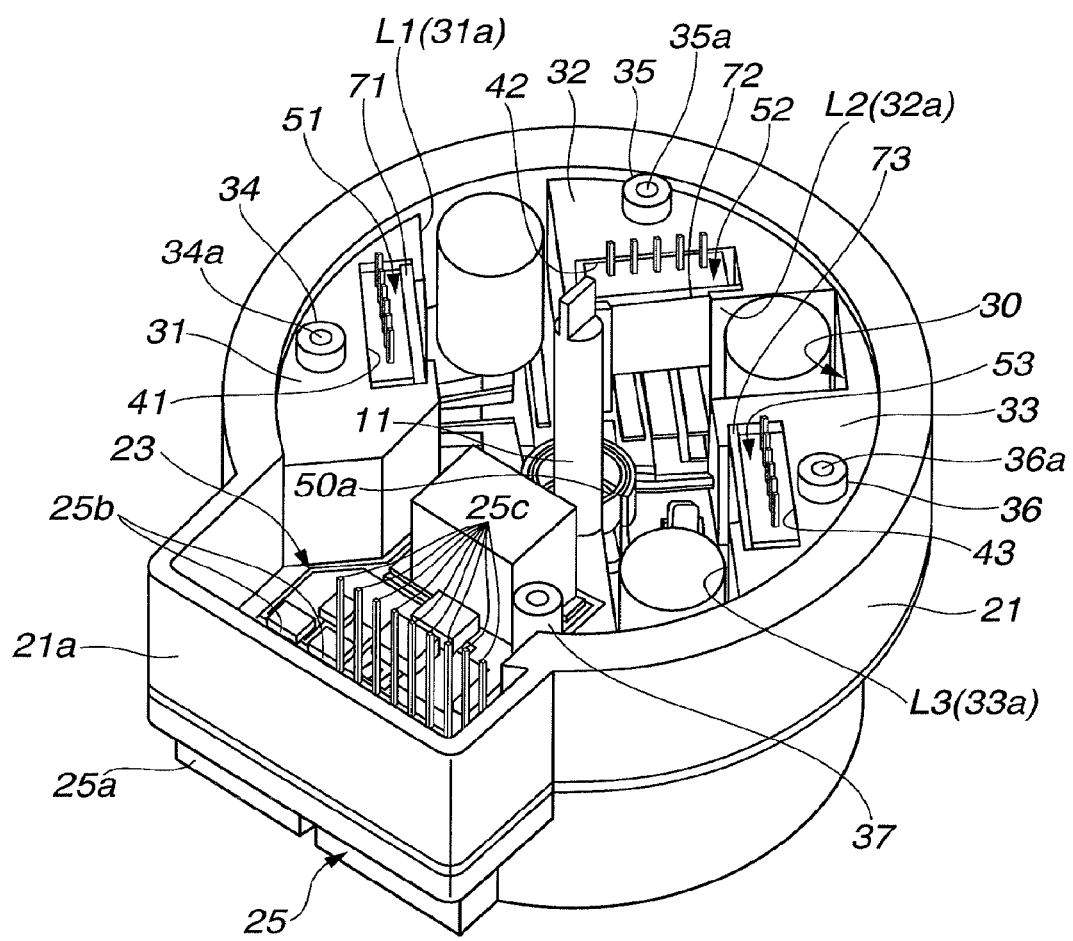
FIG. 3 is a view showing a first embodiment according to the present invention, and showing a state where a control substrate has been detached from the motor drive apparatus of FIG. 2.

FIGS. 1 to 7 are views showing a first embodiment according to the present invention. As shown in FIGS. 1 to 3, a motor drive apparatus in the first embodiment mainly includes a so-called three-phase alternating-current motor 10, and an ECU 20 for driving and controlling the motor 10. The ECU 20 is attached (annexed) to axially one-end side of the motor 10 on which an output shaft 11 of the motor 10 protrudes. The ECU 20 is disposed coaxially to the motor 10 so as to surround an outer circumference of tip side of the output shaft 11.

The ECU 20 mainly includes an ECU housing 21, an ECU cover 22, a power substrate (board) 23, a control substrate (board) 24 and a connector 25. One-end side of the ECU housing 21 is open, and another-end side of the ECU housing 21 is almost closed. The ECU housing 21 is attached and fixed to one-end portion of the motor 10. The ECU cover 22 closes or covers the one-end opening of the ECU housing 21. The power substrate 23 is received and accommodated in the ECU housing 21. The power substrate 23 constitutes an electric-power supply circuit serving to supply electric power to the motor 10. The control substrate 24 is electrically connected to the power substrate 23 inside the ECU housing 21. The control substrate 24 controllably drives the motor 10 by controlling the power substrate 23 by means of after-mentioned power modules 51 to 53. The connector 25 is attached and fixed to the ECU housing 21, and is connected to the power substrate 23 and the control substrate 24. Thereby, the connector 25 serves to conduct an electric-power supply from a battery (not shown) and an information input (steering torque signal, vehicle-speed signal in a case of power steering apparatus), and the like.

The ECU housing 21 is formed of metallic material having a high heat-radiation performance such as an aluminium alloy. The ECU housing 21 is formed approximately in a cylindrical shape having its bottom. Moreover, the ECU housing 21 is formed with a substrate receiving portion 30 for receiving the power substrate 23, in an inner circumferential side (in a radially inner portion) of the ECU housing 21. This substrate receiving portion 30 is formed by drilling (or gouging) through the solid metallic material in the axial direction of the motor 10 along an after-mentioned outer shape of the power substrate 23. An axial width H of the ECU housing 21 is determined in conformity to the highest one (axially-longest one) of electronic components mounted in the power substrate 23. In this example, the highest electronic component is each of after-mentioned electrolytic condensers 54 to 56 and the like. As shown in FIG. 3, some electronic components (i.e., the after-mentioned electrolytic condensers 54 to 56, a coil 58 and the like) mounted in the power substrate 23 are collectively received and accommodated in the substrate receiving portion 30, together with a base portion of the power substrate 23.

Because the substrate receiving portion 30 is drilled through the solid metallic material of the ECU housing 21, a plurality of heat sinks are formed by a residual portion of the solid metallic material except the substrate receiving portion 30 in the inner circumferential side of the ECU housing 21. In this embodiment, these plurality of heat sinks are first to third three heat sinks 31 to 33. The heat sink 31 is provided near the after-mentioned power module 51 and electrolytic condenser 54, i.e., corresponds to a location of the power module 51 and the electrolytic condenser 54. The heat sink 32 is provided near the after-mentioned power module 52 and electrolytic condenser 55, i.e., corresponds to a location of the power module 52 and the electrolytic condenser 55. The heat sink 33 is provided near the after-mentioned power module 53 and electrolytic condenser 56, i.e., corresponds to a location of the power module 53 and the electrolytic condenser 56. Thereby, these heat sinks 31 to 33 serve to cool the power modules 51 to 53 and the electrolytic condensers 54 to 56.

That is, the heat sinks 31 to 33 include first to third module receiving portions 41 to 43 which respectively receive the after-mentioned first to third power modules 51 to 53. The first to third module receiving portions 41 to 43 are formed by cutting or drilling in the axial direction through maximum-width portions L1 to L3 (portions each having a maximum width level) among a sidewall portion facing the substrate receiving portion 30. Sidewalls (peripheral walls) 31a to 33a except the first to third module receiving portions 41 to 43 among the sidewall portion facing the substrate receiving portion 30 approximately surround the electrolytic condensers 54 to 56 at a close distance.

On axially one end surface (upper end surface as viewed in FIG. 3) of each of the heat sinks 31 to 33, a boss portion 34-36 is provided for attaching and fixing the control substrate 24 to the ECU housing 21. Each of the boss portion 34-36 protrudes from the axially one end surface of the corresponding heat sink 31-33. In an inner-circumferential portion (radially-inner portion) of each boss portion 34-36, a female-thread hole 34a-36a is formed. A screw 38 (see FIG. 2) is screwed into each female-thread hole 34a-36a to fix the control substrate 24 to the ECU housing 21. That is, the control substrate 24 is fastened to the ECU housing 21 by means of screws, at the respective boss portions 34 to 36 provided on the axially one end surfaces of the heat sinks 31 to 33 and at a fourth boss portion 37 provided in a standing manner inside the ECU housing 21. The respective boss portions 34 to 36 and the fourth boss portion 37 are located approximately at circumferentially even intervals in the ECU housing 21.

Moreover, the ECU housing 21 includes a radially protruding portion 21a that protrudes in a radially outer direction of the motor 10 beyond an outer diameter of the motor 10 (i.e., beyond an outer circumferential surface of the motor 10). The radially protruding portion 21a is shaped to be open in axially both directions of the motor 10. That is, one side of the radially protruding portion 21a communicates with the substrate receiving portion 30, and another side of the radially protruding portion 21a is formed as a connector attaching portion 39 that is open to the side of the motor 10. The connector 25 is attached and fixed to the connector attaching portion 39.

Figure 4:
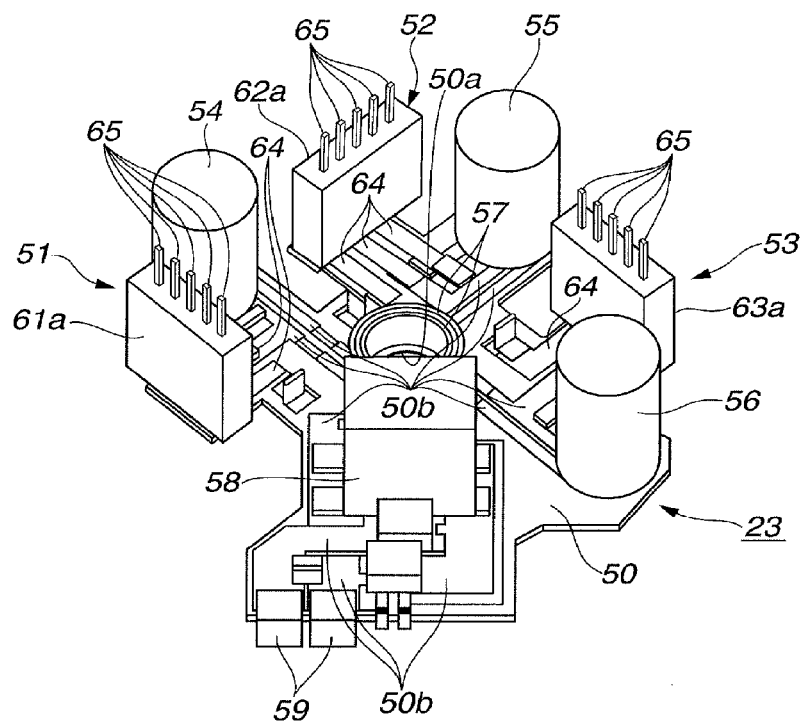
FIG. 4 is an oblique perspective view of a power substrate shown in FIG. 3.

As shown in FIG. 4, the power substrate 23 is constituted by mounting the first to third power modules 51 to 53, the first to third electrolytic condensers 54 to 56, the coil 58 and the like, on a wiring pattern 50b formed through an insulating layer on a metallic substrate 50. The metallic substrate 50 is a base of the power substrate 23 and is formed with a motor-shaft insertion hole 50a passing through a substantially central portion of the metallic substrate 50 in the axial direction. The first to third power modules 51 to 53 are provided respectively for three phases (U-phase, V-phase and W-phase). Each of the first to third power modules 51 to 53 includes a semiconductor switching element(s) such as MOSFET, a resistor(s), and the like (not shown). The first to third electrolytic condensers 54 to 56 are disposed to be respectively correspond to the power modules 51 to 53. The coil 58 is connected through busbars 57 with the power modules 51 to 53 and the electrolytic condensers 54 to 56. The power substrate 23 is connected through a pair of relay terminals 59 with the connector 25. Through this connector 25, the power substrate 23 is connected to the battery (not shown). It is noted that each of the first to third power modules 51 to 53 corresponds to a semiconductor module according to the present invention.

Figure 5:
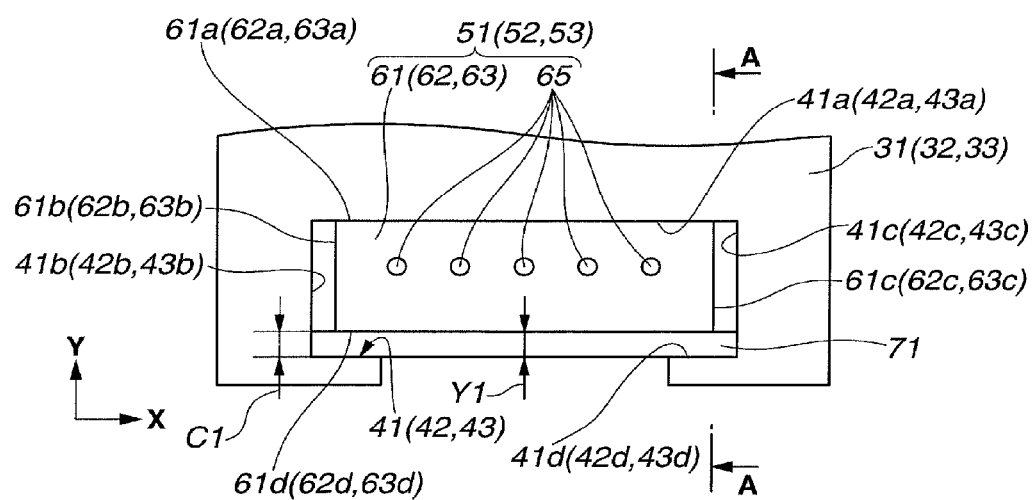
FIG. 5 is an enlarged view of a part of FIG. 3 for the purpose of explaining about structures according to the present invention.

As shown in FIGS. 4 and 5, each of the first to third power modules 51 to 53 includes a module main body 61-63, three lead frames 64 and five lead terminals 65. Each module main body 61-63 is substantially formed in a rectangular shape in cross section and receives the pair of semiconductor switching elements and the resistor(s) and the like therein. The three lead frames serve to electrically connect the module main body 61-63 with the power substrate 23. The five lead terminals 65 serves to electrically connect the module main body 61-63 with the control substrate 24.

Each module main body 61-63 includes a heat-radiating surface 61a-63a, a pair of lateral surfaces 61b-63b and 61c-63c, and a back surface 61d-63d. The heat-radiating surface 61a-63a has a relatively large area (dimensions). A part or whole of the heat-radiating surface 61a-63a is formed of a metallic material. Each of the pair of lateral surfaces 61b-63b and 61c-63c has a relatively small area, and is approximately perpendicular to the heat-radiating surface 61a-63a. The back surface 61d-63d is located on an opposite side of the heat-radiating surface 61a-63a, and is approximately perpendicular to the lateral surfaces 61b-63b and 61c-63c. The module main body 61-63 is formed by resin molding except the heat-radiating surface 61a-63a.

The first to third power modules 51 to 53 are received in the ECU housing 21 such that each of the first to third power modules 51 to 53 is substantially buried in the corresponding one of the first to third the heat sinks 31 to 33, in a manner different from the other mounted components (the respective electrolytic condensers 54 to 56, the coil 58 and the like). That is, although the other mounted components are located in the substrate receiving portion 30, the first to third power modules 51 to 53 are not located in the substrate receiving portion 30. That is, each of the first to third power modules 51 to 53 is accommodated in the corresponding one of the first to third module receiving portions 41 to 43.

Each of the first to third module receiving portions 41 to 43 is formed to face and communicate with the one-end opening portion of the ECU housing 21. An inside portion (inner circumference) of each of the first to third module receiving portions 41 to 43 includes a heat-receiving surface 41a-43a, a pair of lateral support surfaces 41b-43b and 41c-43c, and a pair of back support surfaces 41d-43d. The heat-receiving surface 41a-43a faces (i.e., is opposed to) the heat-radiating surface 61a-63a of the corresponding power module 51-53. The pair of lateral support surfaces 41b-43b and 41c-43c are perpendicular to the heat-receiving surface 41a-43a, and respectively face the lateral surfaces 61b-63b and 61c-63c of the corresponding power module 51-53. The pair of back support surfaces 41d-43d are perpendicular to the lateral support surfaces 41b-43b and 41c-43c, and face the back surface 61d-63d of the corresponding power module 51-53. The first to third the heat sinks 31 to 33 absorb heat of the first to third power modules 51 to 53 through the heat-receiving surfaces 41a to 43a of the first to third module receiving portions 41 to 43.

As show in FIG. 5, each of the first to third module receiving portions 41 to 43 has a larger area in cross section (as viewed in the axial direction) than that of the corresponding module main body 61-63 of the power module 51-53. Each of the power modules 51 to 53 is disposed to be deviated (biased) toward the heat-receiving surface 41a-43a inside the module receiving portion 41-43. Thereby, a predetermined clearance (space) C1 is provided at least between the back surface 61d-63d of the module main body 61-63 and the back support surface 41d-43d of the module receiving portion 41-43. Each of first to third module retaining members 71 to 73 which are pressingly-retaining members is fitted into the corresponding clearance C1 by press fitting. Hence, the first to third power modules 51 to 53 are respectively retained or held inside the first to third module receiving portions 41 to 43. It is noted that each of the first to third module retaining members 71 to 73 corresponds to a module retaining section or means according to the present invention.

Each of the first to third module retaining members 71 to 73 is attached by means of relatively-light press insertion. Therefore, in addition to this press insertion, the back surface 61d-63d of the module main body 61-63 may be bonded to the back support surface 41d-43d of the module receiving portion 41-43 (with a bonding agent).

Figure 6:
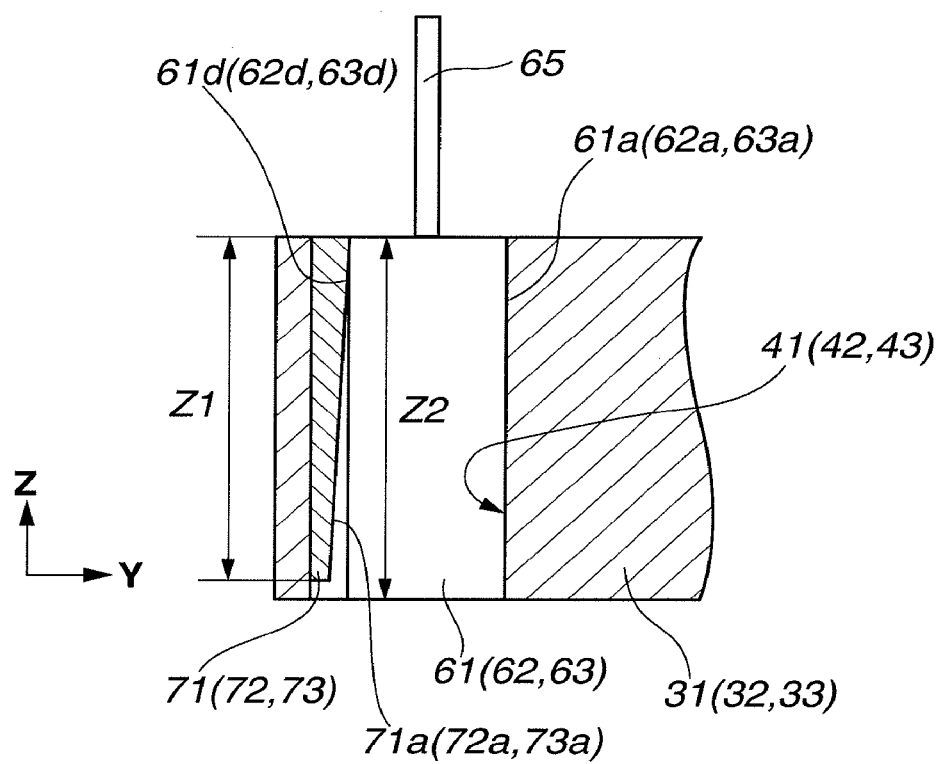
FIG. 6 is a longitudinal sectional view of FIG. 5, taken along a line A-A.
Figure 7:
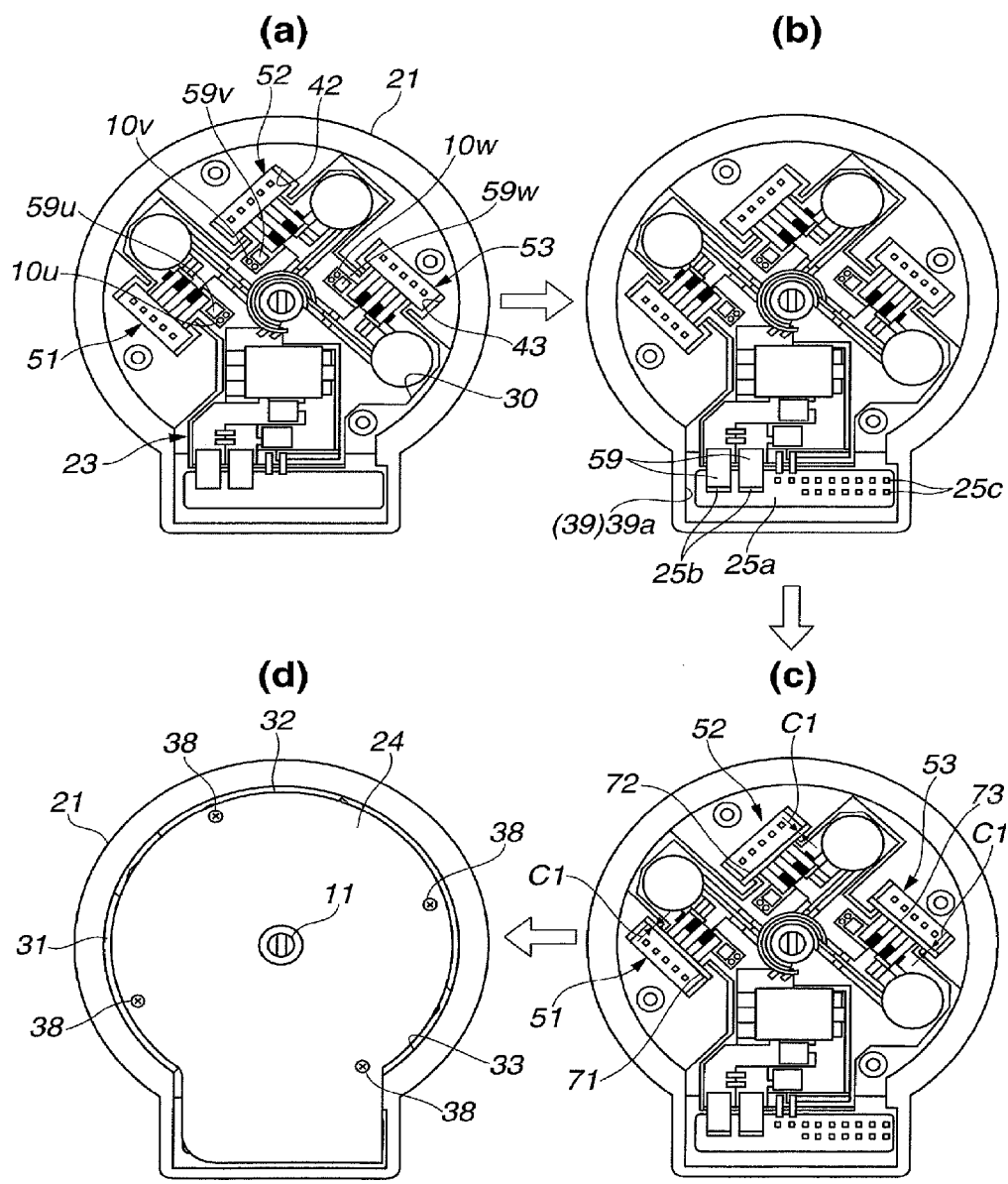
FIG. 7 is a view showing an assembling procedure of the motor drive apparatus in the first embodiment.

Each of the first to third module retaining members 71 to 73 is a block-shaped member formed of a metallic material having a relatively-high thermal conductivity such as aluminium and copper. The first to third module retaining members 71 to 73 are formed in an identical shape with one another. As shown in FIG. 6, each of the first to third module retaining members 71 to 73 is formed in a wedge shape which tapers in longitudinal section (taken by a plane perpendicular to the heat-receiving surface 41a-43a and parallel to the axial direction). That is, each of the module retaining members 71 to 73 includes a tapering surface 71a-73a facing the back surface 61d-63d of the power module 51-53, so that a Y-axis-directional width Y1 (thickness) of the module retaining member 71-73 is gradually reduced (as a measurement point is shifted) toward Z-axis negative direction. The Y-axis-directional width Y1 of the module retaining member 71-73 has its maximum value slightly larger than the clearance C1 at a Z-axis-positive-directional end of the module retaining member 71-73, and has its minimum value smaller than the clearance C1 at a Z-axis-negative-directional end of the module retaining member 71-73. It is noted that, for the purpose of explanations in the drawings, the axial direction of the motor 10 from the motor 10 toward the ECU cover 22 is defined as positive direction of Z-axis. A direction from the back support surface 41d-43d toward the heat-receiving surface 41a-43a which is perpendicular to Z-axis and parallel to the lateral support surface 41b-43b is defined as positive direction of Y-axis. Moreover, a direction from the lateral support surface 41b toward the lateral support surface 41c which is perpendicular to Z-axis and parallel to the heat-receiving surface 41a-43a is defined as positive direction of X-axis.

By virtue of the tapering surface 71a-73a of the module retaining member 71-73, the module main body 61-63 is pressed toward an inner side of the module receiving portion 41-43 (i.e., downwardly in FIG. 6), while the heat-radiating surface 61a-63a is pressed toward the heat-receiving surface 41a-43a. By means of such a pressing force applied by the tapering surface 71a-73a, namely by means of a friction force based on a press contact between the module retaining member 71-73 and the back support surface 41d-43d, a friction force based on a press contact between the module retaining member 71-73 and the back surface 61d-63d and a friction force based on a press contact between the heat-radiating surface 61a-63a and the heat-receiving surface 41a-43a; whole of the heat-radiating surface 61a-63a is in intimate contact with the heat-receiving surface 41a-43a, and a part of the back surface 61d-63d is in intimate contact with the module retaining member 71-73 which is in intimate contact with the back support surface 41d-43d. Under such a condition, each power module 51-53 is retained in the module receiving portion 41-43.

A Z-axis-directional width (a length in the axial direction of the motor 10) Z1 of the module retaining member 71-73 is set to be smaller than a Z-axis-directional width Z2 of the module main body 61-63. Thereby, a Z-axis-negative-directional end of the module retaining member 71-73 reliably does not become in contact with the lead frames 64 of the power module 51-53 when the module retaining member 71-73 is mounted.

Each of the electrolytic condensers 54 to 56 is a smoothing condenser which stores electric current supplied from the battery (not shown), and which supplies electric power to the motor 10 in accordance with the operation of the power module 51-53.

The control substrate 24 is constituted by mounting a CPU, a driver circuit and like (not shown) on a printed circuit board (PCB). The control substrate 24 controls the first to third power modules 51 to 53, on the basis of information (signals of steering torque, vehicle speed and the like in the case of power steering apparatus) inputted through the connector 25 from the external and a rotational-position signal of the motor 10 that is detected by a resolver (not shown) disposed in the motor 10.

The connector 25 is formed in substantially linear fashion. The connector 25 includes a connector main body 25a, a pair of flat terminals 25b, and multiple round terminals 25c. The connector main body 25a is formed of resin. The pair of flat terminals 25b are connected with the relay terminals 59 to form an electrical connection therebetween. The multiple round terminals 25c are connected with the control substrate 24 to form an electrical connection therebetween. The pair of flat terminals 25b and the multiple round terminals 25c are held and fixed to an inside of the connector main body 25a. The connector main body 25a is attached and fixed to (the connector attaching portion 39 of) the radially protruding portion 21a of the ECU housing 21. As shown in FIGS. 7(a) to 7(c), via a terminal insertion portion (hole) 39a (motor-side opening portion) formed in the connector attaching portion 39 to pass through the radially protruding portion 21a, the flat terminals 25b and the round terminals 25c are introduced into the ECU housing 21. The introduced flat terminals 25b and round terminals 25c are connected respectively with the relay terminals 59 and the control substrate 24 by welding or the like.

An assembling procedure of the motor drive apparatus will now be explained referring to FIGS. 7(a) to 7(d).

As a first process (step), as shown in FIG. 7(a), the power substrate 23 in which the above-mentioned electronic components and the like have been mounted is set in the ECU housing 21 to which the motor 10 has been attached. In detail, the power substrate 23 is arranged from the one-end opening of the ECU housing 21 into the substrate receiving portion 30. At this time, the power modules 51 to 53 which have been already mounted on the metallic substrate 50 of the power substrate 23 are inserted into the module receiving portions 41 to 43. Then, the power substrate 23 is fixed to the ECU housing 21 by adhesive joining. Then, connecting terminals 10u to 10w for the respective phases of the motor 10 which extend from a back side of the power substrate 23 into the substrate receiving portion 30 are connected with relay terminals 59u to 59w which have been already connected with the metallic substrate 50, by welding.

As a second process (step), as shown in FIG. 7(b), the connector 25 is mounted into the ECU housing 21, and the connector 25 is connected with the power substrate 23. That is, the connector main body 25a is attached and fixed to the connector attaching portion 39 of the ECU housing 21 so that the flat terminals 25b and the like are inserted through the terminal insertion portion 39a into the substrate receiving portion 30. Then, the flat terminals 25b are connected with the relay terminals 59 by welding.

As a third process (step), as shown in FIG. 7(c), the module retaining member 71-73 is inserted into the clearance C1 formed between the back surface 61d-63d of the module main body 61-63 of the power module 51-53 and the back support surface 41d-43d of the module receiving portion 41-43 so that the power module 51-53 is retained in the module receiving portion 41-43.

As a fourth process (step), as shown in FIG. 7(d), the control substrate 24 in which the electronic components and the like have been mounted in advance is placed through the one-end opening of the ECU housing 21 on the heat sinks 31 to 33 so that the control substrate 24 is mounted on the heat sinks 31 to 33. Then, the control substrate 24 is fixed to the ECU housing 21 by means of the screws 38. Moreover, the multiple round terminals 25c of the connector 25 are connected with the control substrate 24 by soldering. Then, the one-end opening of the ECU housing 21 is covered or closed by the ECU cover 22 (see FIG. 1). Thereby, the assembly of the motor drive apparatus is completed.

According to the motor drive apparatus in the first embodiment, the power module 51-53 is arranged on the metallic substrate 50 to cause major surfaces of the power module 51-53 to be perpendicular to the control substrate 24. Moreover, the heat-radiating surface 61a-63a having the maximum area among the module main body 61-63 of the power module 51-53 is made to be in contact with the heat-receiving surface 41a-43a constituted inside the heat sink 31-33. That is, the heat-radiating surface 61a-63a is not in contact with a surface of the metallic substrate 50 as an earlier technology. Therefore, an area of the metallic substrate 50 which is occupied (contacted) by the power modules 51 to 53 can be reduced. That is, an area (i.e., dimensions in a plane perpendicular to the axial direction of motor 10) of the substrate receiving portion 30 of the ECU housing 21 can be reduced resulting in a downsizing of the ECU 20.

The power modules 51 to 53 are held under a state where the heat-radiating surfaces 61a to 63a of the module main bodies 61 to 63 are in press contact with (in intimate contact with) the heat-receiving surfaces 41a to 43a of the heat sinks 31 to 33. Hence, heat of the module main bodies 61 to 63 can be efficiently transmitted to the heat sinks 31 to 33, so that the heat radiation of the power modules 51 to 53 can be effectively performed.

The Z-axis-directional width Z1 of each module retaining member 71-73 is smaller than the Z-axis-directional width Z2 of the module main body 61-63. Moreover, the Y-axis-directional width of the Z-axis-positive-directional end of the module retaining member 71-73 is set to properly retain the module main body 61-63 in the module receiving portion 41-43. Hence, when assembling each module retaining member 71-73 into the module receiving portion 41-43, the module retaining member 71-73 has only to be pushed or slid until the Z-axis-positive-directional end of the module retaining member 71-73 comes to form a common flat surface together with a Z-axis-positive-directional end of the heat sink 31-33. That is, a pushing amount of the module retaining member 71-73 does not need to be managed. Therefore, an assembling workability of the apparatus can be simplified and thereby improved.

In the first embodiment, the tapering surface 71a-73a is formed only in the surface of the module retaining member 71-73 which faces the power module 51-53 (i.e. which faces the back surface 61d-63d). However, as mentioned above, the module retaining member 71-73 has only to be constructed to press the module main body 61-63 toward the heat-receiving surface 41a-43a. Hence, the tapering surface 71a-73a may be formed in the surface of the module retaining member 71-73 which faces the back support surfaces 41d-43d of the module receiving portion 41-43. Alternatively, the tapering surface 71a-73a may be formed in both of the surface of the module retaining member 71-73 which faces the power module 51-53 and the surface of the module retaining member 71-73 which faces the back support surface 41d-43d.

Moreover, the module retaining member 71-73 may be interposed between the heat-radiating surface 61a-63a and the heat-receiving surface 41a-43a. Even in this case, heat of the module main body 61-63 is transmitted indirectly through the module retaining member 71-73 to the heat sink 31-33 (i.e., to the heat-receiving surface 41a-43a). Therefore, a sufficient heat radiation of the module main body 61-63 can be performed.

Figure 8:
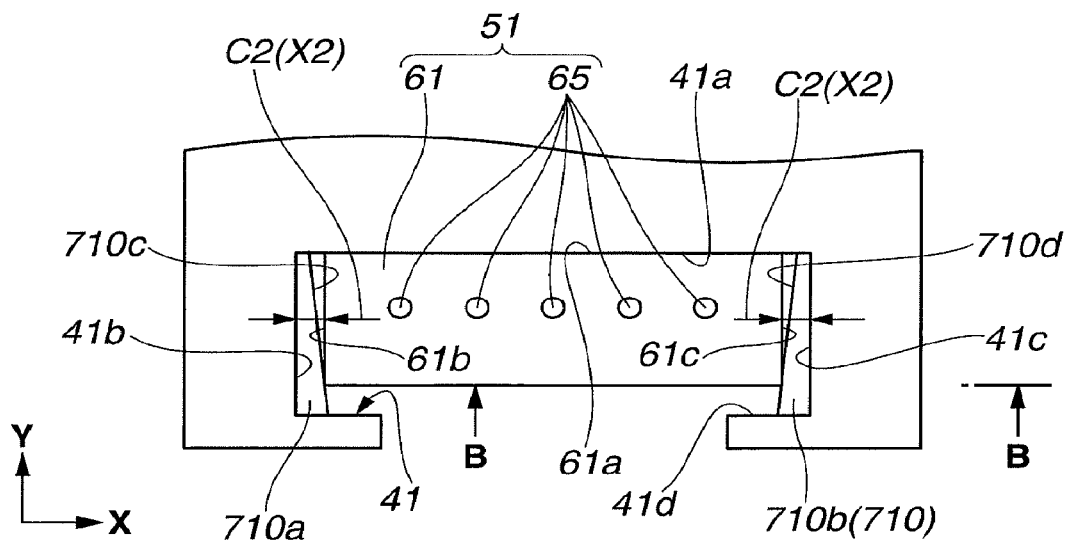
FIG. 8 is a view showing a second embodiment according to the present invention, and corresponding to FIG. 5 of the first embodiment.
Figure 9:
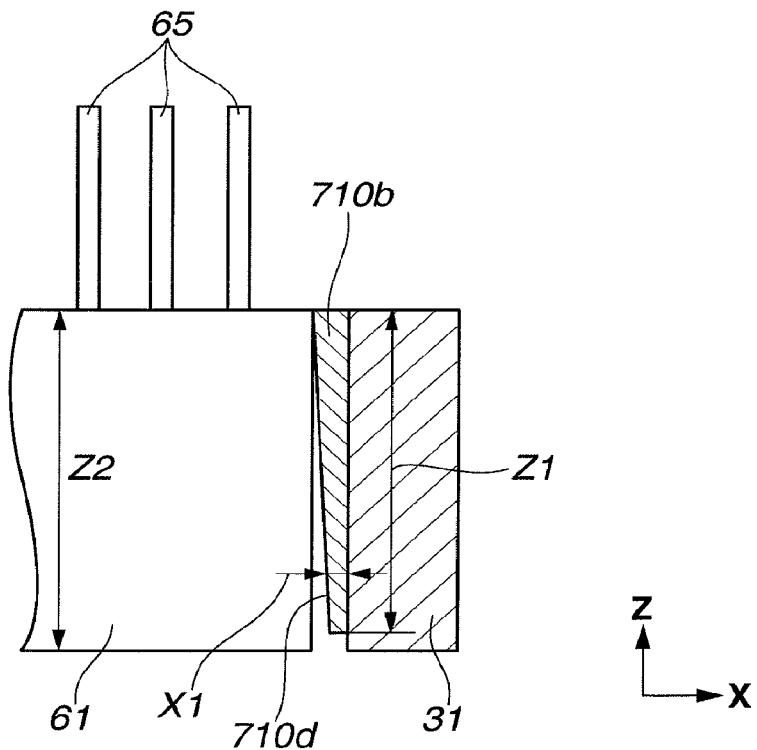
FIG. 9 is a longitudinal sectional view of FIG. 8, taken along a line B-B.

FIGS. 8 and 9 are views showing a second embodiment of the motor drive apparatus according to the present invention. The structure of the module retaining members 71 to 73 according to the first embodiment is modified in the second embodiment. Since this modification is identical among the first to third module retaining members 71 to 73, explanations only about the first module retaining member 71 will be given, and explanations about the second and third module retaining members 72 and 73 will be omitted for the purpose of simplification of the disclosure.

In the second embodiment, a pair of module retaining members 710a and 710b are provided in the module receiving portion 41 instead of the module retaining member 71. That is, one module retaining member 710a is inserted (pushed with force) into a clearance (space) C2 formed between the lateral surface 61b of the power module 51 and the lateral support surface 41b of the module receiving portion 41. At the same time, another module retaining member 710b is inserted (pushed with force) into a (another) clearance C2 formed between the lateral surface 61c of the power module 51 and the lateral support surface 41c of the module receiving portion 41.

The pair of module retaining members 710a and 710b are formed basically to fill the both clearances C2. A maximum value of an X-axis-directional width X1 of each module retaining member 710a, 710b is set to be slightly larger than an X-axis-directional width X2 of the clearance C2. Moreover, a predetermined tapering surface 710c is formed in a surface of the module retaining member 710a which faces the lateral surface 61b of the power module 51. The other lateral surfaces (among surfaces existing on X-Y plane of FIG. 8) of the module retaining member 710a are parallel to the corresponding inner circumferential surfaces of the module receiving portion 41. The tapering surface 710c is formed to gradually reduce the X-axis-directional width X1 of the module retaining member 710a (as a measurement point is shifted) toward a Y-axis-positive direction. Moreover, the tapering surface 710c is formed to gradually reduce the X-axis-directional width X1 of the module retaining member 710a toward the Z-axis-negative direction in the same manner as the first embodiment. That is, the X-axis-directional width X1 of the module retaining member 710a is gradually reduced from a Y-axis-negative-directional end of the module retaining member 710a toward a Y-axis-positive-directional end of the module retaining member 710a, and also gradually reduced from a Z-axis-positive-directional end of the module retaining member 710a toward a Z-axis-negative-directional end of the module retaining member 710a. In the same manner, a predetermined tapering surface 710d is formed in a surface of the module retaining member 710b which faces the lateral surface 61c of the power module 51. The other lateral surfaces (among surfaces existing on the X-Y plane of FIG. 8) of the module retaining member 710b are parallel to the corresponding inner surfaces of the module receiving portion 41. The tapering surface 710d is formed to gradually reduce the X-axis-directional width X1 of the module retaining member 710b toward the Y-axis-positive direction. Moreover, the tapering surface 710d is formed to gradually reduce the X-axis-directional width X1 of the module retaining member 710b toward the Z-axis-negative direction in the same manner as the first embodiment. That is, the X-axis-directional width X1 of the module retaining member 710b is gradually reduced from a Y-axis-negative-directional end of the module retaining member 710b toward a Y-axis-positive-directional end of the module retaining member 710b, and also from a Z-axis-positive-directional end of the module retaining member 710b toward a Z-axis-negative-directional end of the module retaining member 710b.

Therefore, also in the second embodiment, the heat-radiating surface 61a of the power module 51 is pressed to the heat-receiving surface 41a and also to the inner side of the module receiving portion 41 (i.e., downwardly in FIG. 9) by means of both the tapering surfaces 710c and 710d of the pair of module retaining members 710a and 710b inserted into the clearances C2. Thereby, the power module 51 is held properly in the module receiving portion 41. As a result, the advantageous effects similar as in the first embodiment can be obtained.

In the second embodiment, both the module retaining members 710a and 710b are in intimate contact with the inner circumferential surfaces of the module receiving portion 41. Therefore, a heat-radiation effect can be obtained also from the lateral surfaces 61b and 61c in addition to the heat-radiating surface 61a. Hence, the heat-radiation effect which is produced by the heat sink 31 can be further enhanced.

Moreover, in the second embodiment, each tapering surface 710c, 710d is formed only in the surface of the module retaining member 710a, 710b which faces the power module 51 (i.e. which faces the lateral surface 61b, 61c). However, the tapering surface 710c, 710d may be formed in the surface of the module retaining member 710a, 710b which faces the lateral support surface 41b, 41c of the module receiving portion 41. Alternatively, the tapering surface 710c, 710d may be formed in both of the surface of the module retaining member 710a, 710b which faces the power module 51 and the surface of the module retaining member 710a, 710b which faces the lateral support surface 41b, 41c.

Figure 10:
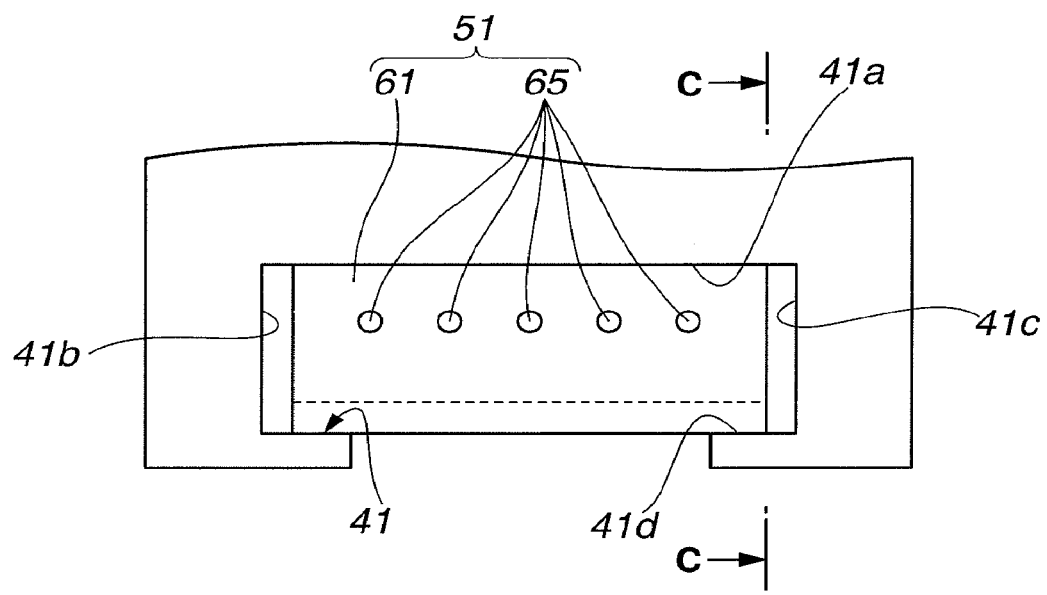
FIG. 10 is a view showing a third embodiment according to the present invention, and corresponding to FIG. 5 of the first embodiment.
Figure 11:
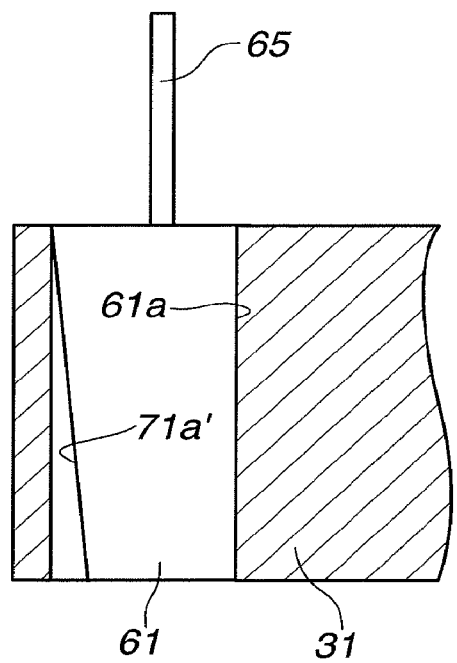
FIG. 11 is a longitudinal sectional view of FIG. 10, taken along a line C-C.

FIGS. 10 and 11 are views showing a third embodiment of the motor drive apparatus according to the present invention. In the third embodiment, the module retaining members 71 to 73 according to the first embodiment are integrated respectively with the module main bodies 61 to 63 of the power modules 51 to 53. Since this modification is identical among the first to third power modules 51 to 53, explanations only about the first power module 51 will be given, and explanations about the second and third power modules 52 and 53 will be omitted for the purpose of simplification of the disclosure.

In the third embodiment, the module retaining member 71 is removed, and the back surface 61d (71a') of the module main body 61 of the power module 51 is formed in the similar manner as the tapering surface 71a of the module retaining member 71 according to the first embodiment. By such a structure, when the power module 51 is inserted into the module receiving portion 41, the entire heat-radiating surface 61a is pressed to the heat-receiving surface 41a of the module receiving portion 41 to abut on the heat-receiving surface 41a, and a part of the back surface 61d is pressed to the back support surface 41d of the module receiving portion 41 to abut on the back support surface 41d. Therefore, in the same manner as in the first embodiment, the power module 51 can be held in the module receiving portion 41 under the state where the heat-radiating surface 61a is in intimate contact with the heat-receiving surface 41a. As a result, the advantageous effects similar as the first embodiment can be obtained.

Although the module main body 61 of the power module 51 is formed separately from the module retaining member 71 in the first embodiment, the module main body 61 is formed integrally with the module retaining member 71 in the third embodiment. Hence, in this third embodiment, the number of structural components of the apparatus can be reduced. Therefore, man-hours for assembly of the apparatus can be reduced while simplifying an assembling work and the like. As a result, the manufacturing cost of the apparatus can be reduced.

In this third embodiment, the tapering surface 71a' is provided only to the surface (61d) of the module main body 61 which faces the back support surface 41d of the module receiving portion 41. However, according to the present invention, the tapering surface may be provided to the heat-radiating surface 61a facing the heat-receiving surface 41a of the module receiving portion 41. Alternatively, the tapering surfaces may be provided to both of the surface 61d facing the back support surface 41d and the heat-radiating surface 61a facing the heat-receiving surface 41a, as mentioned also in the first embodiment.

Figure 12:
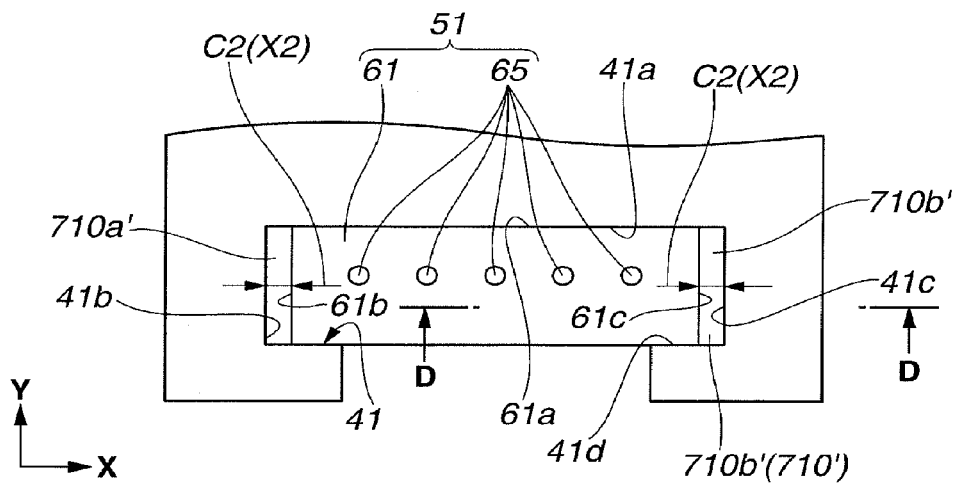
FIG. 12 is a view showing a fourth embodiment according to the present invention, and corresponding to FIG. 5 of the first embodiment.
Figure 13:
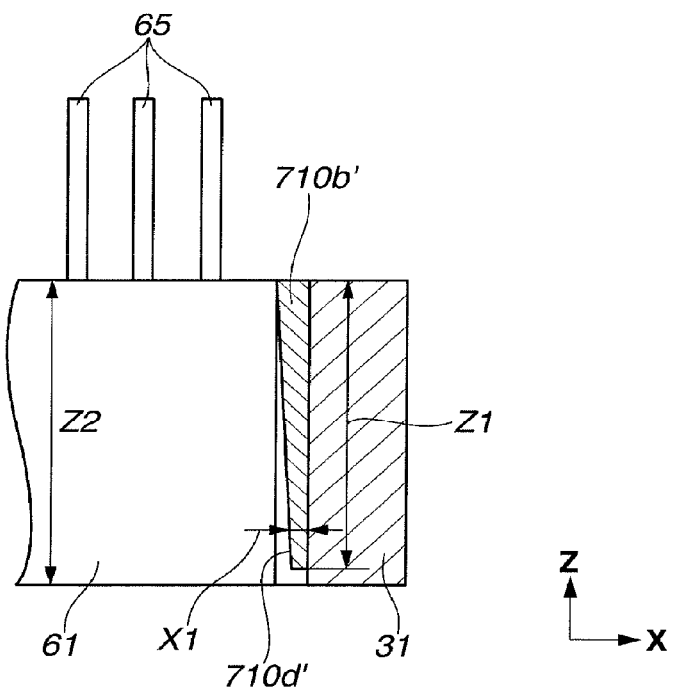
FIG. 13 is a longitudinal sectional view of FIG. 12, taken along a line D-D.

FIGS. 12 and 13 are views showing a fourth embodiment of the motor drive apparatus according to the present invention. In the fourth embodiment, the structures of the module retaining members 710 to 730 according to the second embodiment are modified. Since this modification is identical among the first to third module retaining members 710 to 730, explanations only about the first module retaining member 710 will be given, and explanations about the second and third module retaining members 720 and 730 will be omitted for the purpose of simplification of the disclosure.

In the fourth embodiment, the X-axis-directional width X1 of each of a pair of module retaining members 710a' and 710b' (corresponding to the module retaining members 710a and 710b of the second embodiment) is constant along the Y-axis. Moreover, the X-axis-directional width X1 of each of the pair of module retaining members 710a' and 710b' has a slightly larger size than the X-axis-directional width X2 of the clearance C2, at its most positive end relative to the Z-axis.

Also in this fourth embodiment, the module main body 61 of the power module 51 can be held and fastened by the pair of module retaining members 710a' and 710b'. Because (largest surface of) the power module 51 is arranged perpendicular to the control substrate 24, the ECU 20 can be downsized.

Moreover, in this fourth embodiment, the power module 51 is received in the module receiving portion 41 such that the power module 51 is pressed against the surfaces 41a and 41d of the module receiving portion 41 in the negative and positive directions of Y-axis. Hence, the heat-radiation effect of the heat-radiating surface 61a can be ensured.

In the fourth embodiment, the lateral surfaces 61b and 61c of the power module 51 are in press-contact with the module retaining members 710a' and 710b' which are in press-contact with the lateral support surfaces 41b and 41c. Hence, the heat-radiation effect can be obtained also from the lateral surfaces 61b and 61c. Therefore, the heat-radiation effect of the heat sink 31 can be further enhanced.

In the fourth embodiment, each tapering surface 710c', 710d' is formed only in the surface of the module retaining member 710a', 710b' which faces the power module 51 (i.e. which faces the lateral surface 61b, 61c). However, the tapering surface 710c', 710d' may be formed in the surface of the module retaining member 710a', 710b' which faces the lateral support surface 41b, 41c of the module receiving portion 41. Alternatively, the tapering surface 710c', 710d' may be formed in both of the surface of the module retaining member 710a', 710b' which faces the power module 51 and the surface of the module retaining member 710a', 710b' which faces the lateral support surface 41b, 41c.

Figure 14:
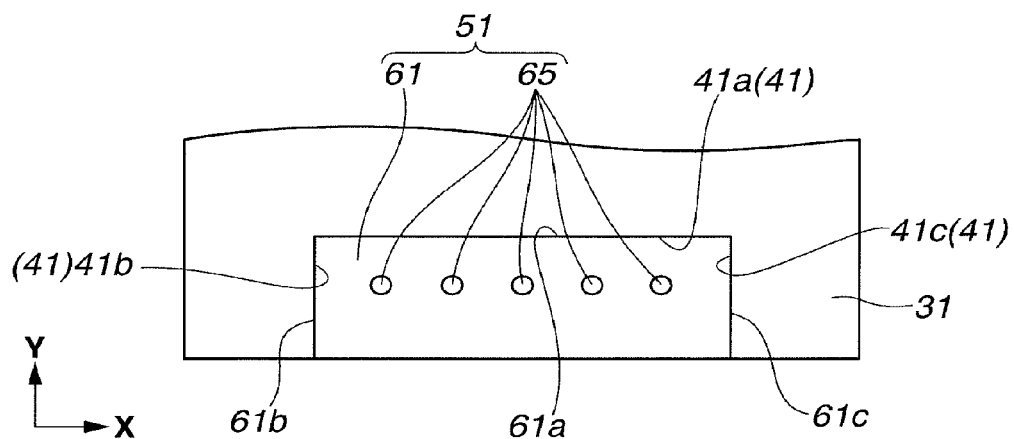
FIG. 14 is a view showing a fifth embodiment according to the present invention, and corresponding to FIG. 5 of the first embodiment.

FIG. 14 is a view showing a fifth embodiment of the motor drive apparatus according to the present invention. In the fifth embodiment, the means for retaining the power modules 51 to 53 according to the first embodiment is modified. Since this modification is identical among the first to third power modules 51 to 53, explanations only about the first power module 51 will be given, and explanations about the second and third power modules 52 and 53 will be omitted for the purpose of simplification of the disclosure.

In the fifth embodiment, the back support surfaces 41d of the module receiving portion 41 are removed, i.e., (entire range of) a Y-axis-negative-directional side of the module receiving portion 41 is formed to open to the substrate receiving portion 30. Moreover, inner dimensions of the module receiving portion 41 are slightly smaller than outer dimensions of the power module 51 (module main body 61), so that the power module 51 is retained under a pressed state inside the module receiving portion 41.

Also in such a structure, the heat-radiating surface 61a of the module main body 61 can be forced to be in intimate contact with the heat-receiving surface 41a of the module receiving portion 41. Therefore, the advantageous effects similar as in the first embodiment can be obtained.

Moreover, in the fifth embodiment, the first to third module retaining members 71 to 73 are unnecessary. Hence, the number of structural components of the apparatus can be reduced resulting in the improvement in productivity and the reduction in manufacturing cost.

Figure 15:
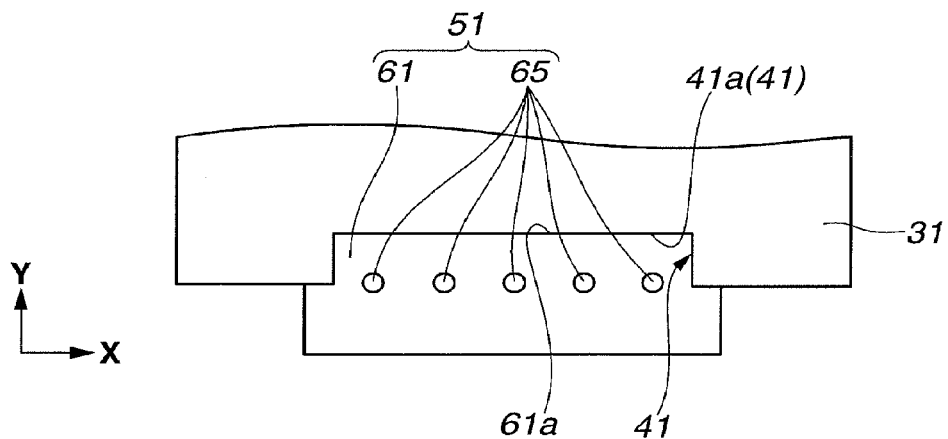
FIG. 15 is a view showing a modification of the fifth embodiment, and corresponding to FIG. 5 of the first embodiment.

In this fifth embodiment, the entire module main body 61 is received inside the module receiving portion 41, i.e., the back surface 61d of the module main body 61 does not protrude from the module receiving portion 41. However, according to the present invention, the entire module main body 61 is not necessarily received inside the heat sink 31. For example, as shown in FIG. 15, the module receiving portion 41 may be scaled down. In this case, a part of the module main body 61 is pushed with force into the module receiving portion 41 and retained under the pressed state. Also in this embodiment, the advantageous effects as mentioned above can be obtained.

Although the invention has been described above with reference to certain embodiments of the invention, the invention is not limited to the embodiments described above. Modifications and variations of the embodiments described above will occur to those skilled in the art in light of the above teachings.

For example, the shapes of the ECU housing 21 and the respective substrates 23 and 24 can be modified freely depending on specifications or the like of its application target (e.g., power steering apparatus). Also, the structure (type, arrangement) of the components that are mounted in the power substrate 23 can be modified freely depending on the specifications or the like of its application target.

In the above respective embodiments, the power modules 51 to 53 constituted by the module main bodies 61 to 63 each including the pair of semiconductor switching elements and the resistors therein are exemplified as the semiconductor modules according to the present invention. However, the semiconductor module according to the present invention is not limited to compositive unit as the power module 51-53, and may be a semiconductor device alone. In other words, the advantageous effects of the above respective embodiments can be obtained even if each of the power modules 51 to 53 in the above respective embodiments is replaced with a semiconductor device alone.

Moreover, in the above respective embodiments, the tapering surface 71a-73a (710c, 710d, 71a', 710c', 710d', etc.) is formed only in the side of the module retaining member 71-73 (710a, 710b, 710a', 710b') or the module main body 61-63. However, according to the present invention, in addition to this, a tapering surface which meets (engages with) a shape of the tapering surface 71a-73a (710c, 710d, 710c', 710d', etc.) may be formed in, e.g., the surface of the module main body 61-63 which faces the tapering surface 71a-73a (710c, 710d, 710c', 710d', etc.). Alternatively, this another tapering surface may be formed in the back support surface 41d-43d of the module receiving portion 41-43 in the case where the tapering surface 71a' is provided to the module main body 61-63. In such cases, by virtue of mutual engagement between both the tapering surfaces, the module main body 61-63 can be more properly in intimate contact with the heat sink 31-33 or can be more properly in intimate contact with the module retaining member 71-73 (710a, 710b, 710a', 710b') which is in intimate contact with the heat sink 31-33. Accordingly, a more effective heat radiation of the power modules 51 to 53 can be realized.

In the above respective embodiments, the module retaining member 71-73 (710a, 710b, 710a', 710b') is formed of metallic material. However, the module retaining member 71-73 (710a, 710b, 710a', 710b') can be formed of resin material instead of the metallic material. In the case that the module retaining member 71-73 (710a, 710b, 710a', 710b') is formed of resin material, there is no risk that the module retaining member 71-73 (710a, 710b, 710a', 710b') damages the power module 51-53, so that a quality of the apparatus can be improved. Moreover, in this case, an insulating treatment or the like for preventing the module retaining member 71-73 (710a, 710b, 710a', 710b') from interfering with the other circuits becomes unnecessary. Accordingly, the manufacturing cost of the apparatus can be reduced.

The Z-axis-directional width Z1 of the module retaining member 71-73 (710a, 710b, 710a', 710b') can be varied depending on the specifications of the apparatus such as the mounting location of the control substrate 24. This is because the module main body 61-63 has only to be retained inside the module receiving portion 41-43 under the state where the module main body 61-63 is pressed against the heat sink 31-33, by setting the Y-axis-directional width of the Z-axis-positive-directional end of the module retaining member 71-73 at a larger value than the clearance C1 in the first and third embodiments, or by setting the X-axis-directional width of the Z-axis-positive-directional end of the module retaining member 710a, 710b, 710a', 710b' at a larger value than the clearance C2 in the second and fourth embodiments.

In the above respective embodiments, a relay is not provided since the power module 51-53 is constructed to ensure a function of overcurrent protection. However, according to the present invention, such a relay may be provided separately, i.e., independently. In this case, the relay is disposed at a location near the connector 25 (the relay terminals 59) which is closer to the battery, so that adverse effects against the mounted components such as the electrolytic condenser 54-56 are suppressed to a minimum.

This application is based on prior Japanese Patent Application No. 2011-201407 filed on Sep. 15, 2011. The entire contents of this Japanese Patent Application are hereby incorporated by reference.

The scope of the invention is defined with reference to the following claims.

What is claimed is:

1. A motor drive apparatus comprising:
a motor; and
an ECU provided on an axially one-end side of the motor and configured to perform a drive control of the motor, the ECU including
an ECU housing whose one-end side is open, the ECU housing including a heat sink located at an inner portion of the ECU housing, the heat sink including a module receiving portion, the module receiving portion including
a heat-receiving surface, and
an opening portion open to the one-end side of the ECU housing,
a control substrate received by the ECU housing to be substantially perpendicular to the heat-receiving surface and to face the motor,
a plurality of semiconductor modules each inserted through the opening portion and received in the module receiving portion, wherein each of the plurality of semiconductor modules is connected electrically with the control substrate to control a power supply of the motor, wherein each of the plurality of semiconductor modules includes a heat-radiating surface at an outer portion thereof, and
a module retaining section pressing the heat-radiating surface to the heat-receiving surface to retain each of the plurality of semiconductor modules in the module receiving portion.

2. The motor drive apparatus according to claim 1,
wherein an outer circumference of each of the plurality of semiconductor modules includes
the heat-radiating surface having a relatively large area, wherein at least a part of the heat-radiating surface is formed of a metallic material,
a pair of lateral surfaces each having a relatively small area and substantially perpendicular to the heat-radiating surface, and
a back surface located on an opposite side of the heat-radiating surface and substantially perpendicular to the pair of lateral surfaces;
wherein an inner circumference of the module receiving portion includes
the heat-receiving surface facing the heat-radiating surface,
a pair of lateral support surfaces facing the pair of lateral surfaces, and
a back support surface substantially perpendicular to the pair of lateral support surfaces and facing the heat-receiving surface,
wherein a pressingly-retaining member is interposed between the back surface of each of the plurality of semiconductor modules and the back support surface of the module receiving portion, and the module retaining section is constituted by a tapering surface provided to at least one of surfaces of the pressingly-retaining member which face the back surface and the back support surface.

3. The motor drive apparatus according to claim 1,
wherein an outer circumference of each of the plurality of semiconductor modules includes
the heat-radiating surface having a relatively large area, wherein at least a part of the heat-radiating surface is formed of a metallic material,
a pair of lateral surfaces each having a relatively small area and substantially perpendicular to the heat-radiating surface, and
a back surface located on an opposite side of the heat-radiating surface and substantially perpendicular to the pair of lateral surfaces;
wherein an inner circumference of the module receiving portion includes
the heat-receiving surface facing the heat-radiating surface,
a pair of lateral support surfaces facing the pair of lateral surfaces, and
a back support surface substantially perpendicular to the pair of lateral support surfaces and facing the heat-receiving surface,
wherein a pressingly-retaining member is interposed between the lateral surface of each of the plurality of semiconductor modules and the lateral support surface of the module receiving portion, and the module retaining section is constituted by a tapering surface provided to at least a surface of the pressingly-retaining member which faces the lateral surface.

4. The motor drive apparatus according to claim 1,
wherein an outer circumference of each of the plurality of semiconductor modules includes
the heat-radiating surface having a relatively large area, wherein at least a part of the heat-radiating surface is formed of a metallic material,
a pair of lateral surfaces each having a relatively small area and substantially perpendicular to the heat-radiating surface, and
a back surface located on an opposite side of the heat-radiating surface and substantially perpendicular to the pair of lateral surfaces;
wherein an inner circumference of the module receiving portion includes
the heat-receiving surface facing the heat-radiating surface,
a pair of lateral support surfaces facing the pair of lateral surfaces, and
a back support surface substantially perpendicular to the pair of lateral support surfaces and facing the heat-receiving surface,
wherein the module retaining section is constituted by a tapering surface provided to at least the back surface of each of the plurality of semiconductor modules.

5. A motor drive apparatus comprising:
a motor; and
an ECU provided on an axially one side of the motor and configured to perform a drive control of the motor, the ECU including
an ECU housing whose one-end side is open, the ECU housing including a heat sink located at an inner portion of the ECU housing, the heat sink including a module receiving portion, the module receiving portion including
a heat-receiving surface, and
an opening portion open to the one-end side of the ECU housing,
a control substrate received by the ECU housing to be substantially perpendicular to the heat-receiving surface and to face the motor,
a plurality of semiconductor modules each inserted through the opening portion and received in the module receiving portion, wherein each of the plurality of semiconductor modules is connected electrically with the control substrate to control a power supply of the motor, wherein each of the plurality of semiconductor modules includes a heat-radiating surface at an outer portion thereof, and
a module retaining section interposed between the module receiving portion and each of the plurality of semiconductor modules through the opening portion such that a heat generated in each of the plurality of semiconductor modules is transmitted from the heat-radiating surface directly to the heat-receiving surface or indirectly through the module retaining section to the heat sink, wherein the module retaining section retains and fastens each of the plurality of semiconductor modules in the module receiving portion.

6. A motor drive apparatus comprising:
a motor; and
an ECU provided on an axially one side of the motor and configured to perform a drive control of the motor, the ECU including
an ECU housing whose one-end side is open, the ECU housing including a heat sink located at an inner portion of the ECU housing, the heat sink including a module receiving portion, the module receiving portion including
a heat-receiving surface, and
an opening portion open to the one-end side of the ECU housing,
a control substrate received by the ECU housing to be substantially perpendicular to the heat-receiving surface and to face the motor, and
a plurality of semiconductor modules each received and retained inside the module receiving portion through the opening portion in a pressed state, wherein each of the plurality of semiconductor modules is connected electrically with the control substrate to control a power supply of the motor, wherein each of the plurality of semiconductor modules includes a heat-radiating surface at an outer portion thereof such that a heat generated in the each of the plurality of semiconductor modules is transmitted from the heat-radiating surface through the heat-receiving surface to the heat sink.

* * * * *